United States Patent
Ewanchuk et al.

(10) Patent No.: US 10,084,440 B2
(45) Date of Patent: Sep. 25, 2018

(54) SYSTEM COMPRISING A MULTI-DIE POWER MODULE, AND METHOD FOR CONTROLLING THE SWITCHING OF A MULTI-DIE POWER MODULE

(71) Applicant: MITSUBISHI ELECTRIC CORPORATION, Tokyo (JP)

(72) Inventors: Jeffrey Ewanchuk, Rennes (FR); Stefan Mollov, Rennes (FR); Nicolas Voyer, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/574,257

(22) PCT Filed: Jun. 1, 2016

(86) PCT No.: PCT/JP2016/066980
§ 371 (c)(1),
(2) Date: Nov. 15, 2017

(87) PCT Pub. No.: WO2016/199785
PCT Pub. Date: Dec. 15, 2016

(65) Prior Publication Data
US 2018/0131361 A1 May 10, 2018

(30) Foreign Application Priority Data
Jun. 9, 2015 (EP) .................................... 15171267

(51) Int. Cl.
*H03B 1/00* (2006.01)
*H03K 3/00* (2006.01)
(Continued)

(52) U.S. Cl.
CPC ..... *H03K 17/04106* (2013.01); *H01L 25/072* (2013.01); *H03K 19/017509* (2013.01)

(58) Field of Classification Search
CPC ............. H03K 17/063; H03K 17/0822; H03K 17/04123; H03K 2217/0036; H03K 17/687
(Continued)

(56) References Cited

U.S. PATENT DOCUMENTS 8,604,841 B2 * 12/2013 Lobsiger ............... H02M 1/088
327/108
9,350,268 B2 * 5/2016 Eberlein ................... B60L 3/04
(Continued)

FOREIGN PATENT DOCUMENTS

DE  10 2004 049 162 A1  4/2006
EP      2 445 110 A1     4/2012
(Continued)

OTHER PUBLICATIONS

Hofer et al., "Paralleling intelligent IGBT power modules with active gate-controlled current balancing", Power Electronics Specialist Conference, 1996, PESC '96 Record., 27th Annual IEEE, XP-002619276, Jun. 23, 1996, pp. 1312-1316.

*Primary Examiner* — Quan Tra
(74) *Attorney, Agent, or Firm* — Birch, Stewart, Kolasch & Birch, LLP

(57) ABSTRACT

The present invention concerns a system comprising a multi-die power module composed of dies and a controller receiving input patterns for activating the dies of the multi-die power module. The controller comprises means for generating from the input patterns gate to source signals to apply to the dies and for each die, the gate to source voltage is shifted according to a given voltage value.

10 Claims, 7 Drawing Sheets

(51) Int. Cl.
  *H03K 17/041* (2006.01)
  *H01L 25/07* (2006.01)
  *H03K 19/0175* (2006.01)
(58) Field of Classification Search
  USPC .......................................... 327/108, 427, 434
  See application file for complete search history.

(56) References Cited

U.S. PATENT DOCUMENTS

2004/0196678 A1* 10/2004 Yoshimura .......... H02M 7/5387
 363/79
2012/0063187 A1* 3/2012 Sato ................... H02M 3/3374
 363/131

FOREIGN PATENT DOCUMENTS

| EP | 2 911 191 A2 | 8/2015 |
| JP | 2003-169465 A | 6/2003 |
| WO | WO 2005/015741 A2 | 2/2005 |

* cited by examiner

[Fig. 1]
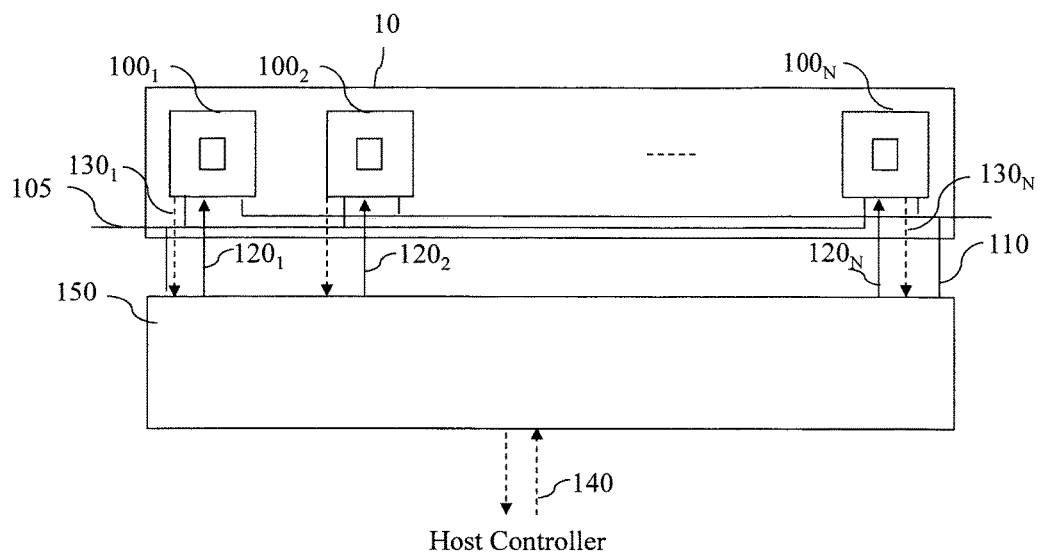
[Fig. 2]
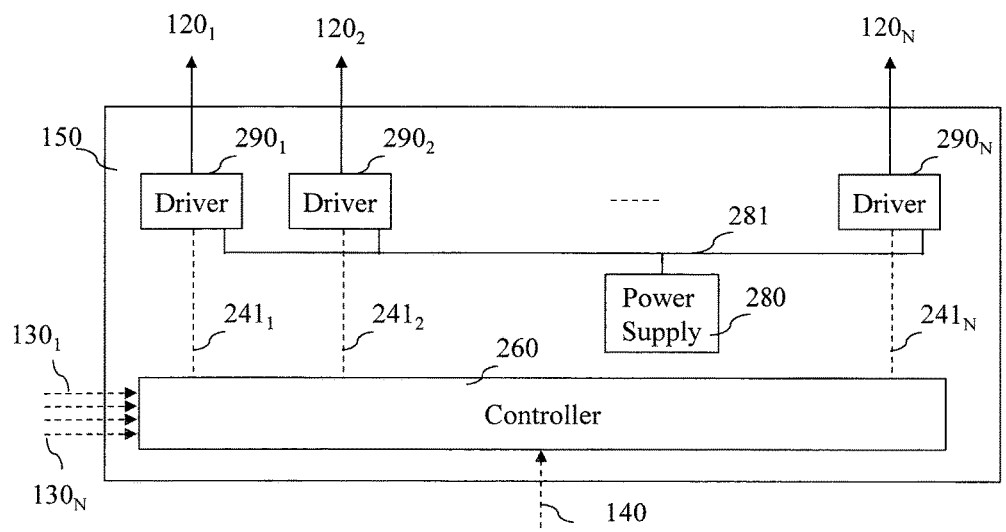

[Fig. 3]
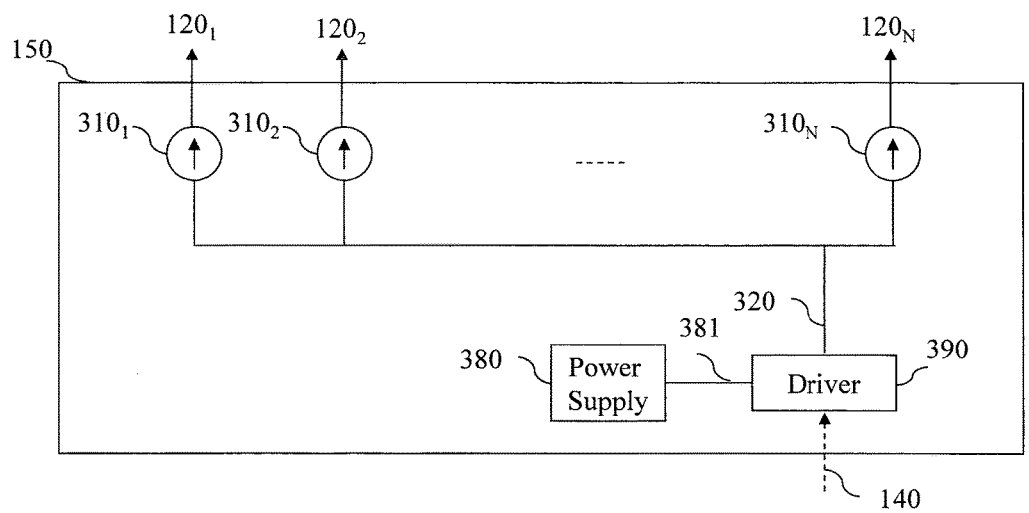
[Fig. 4]
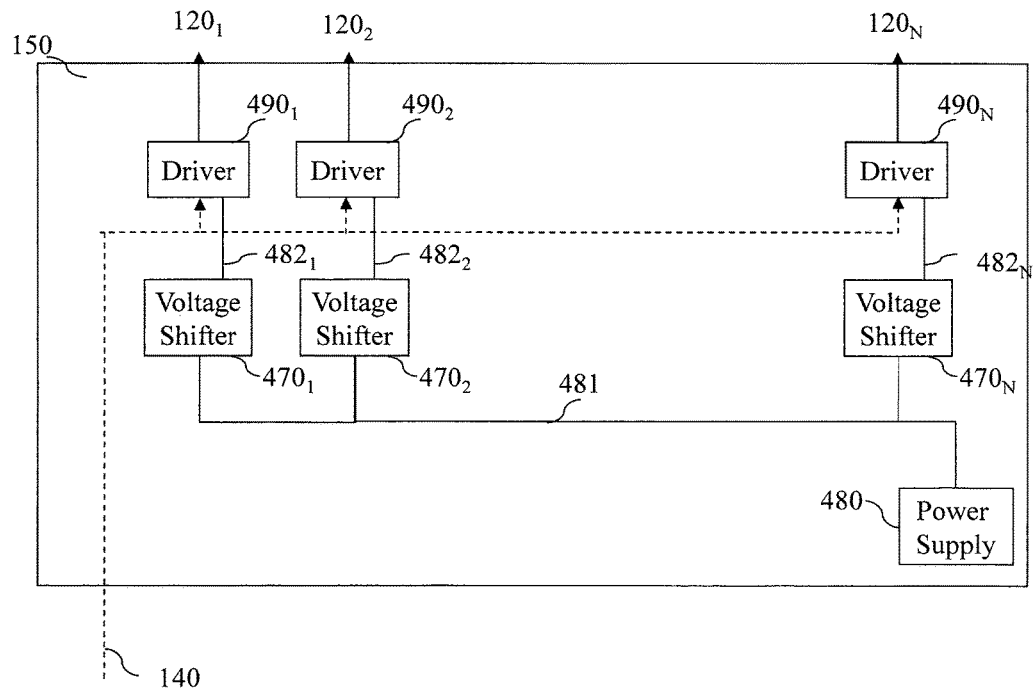

[Fig. 5]
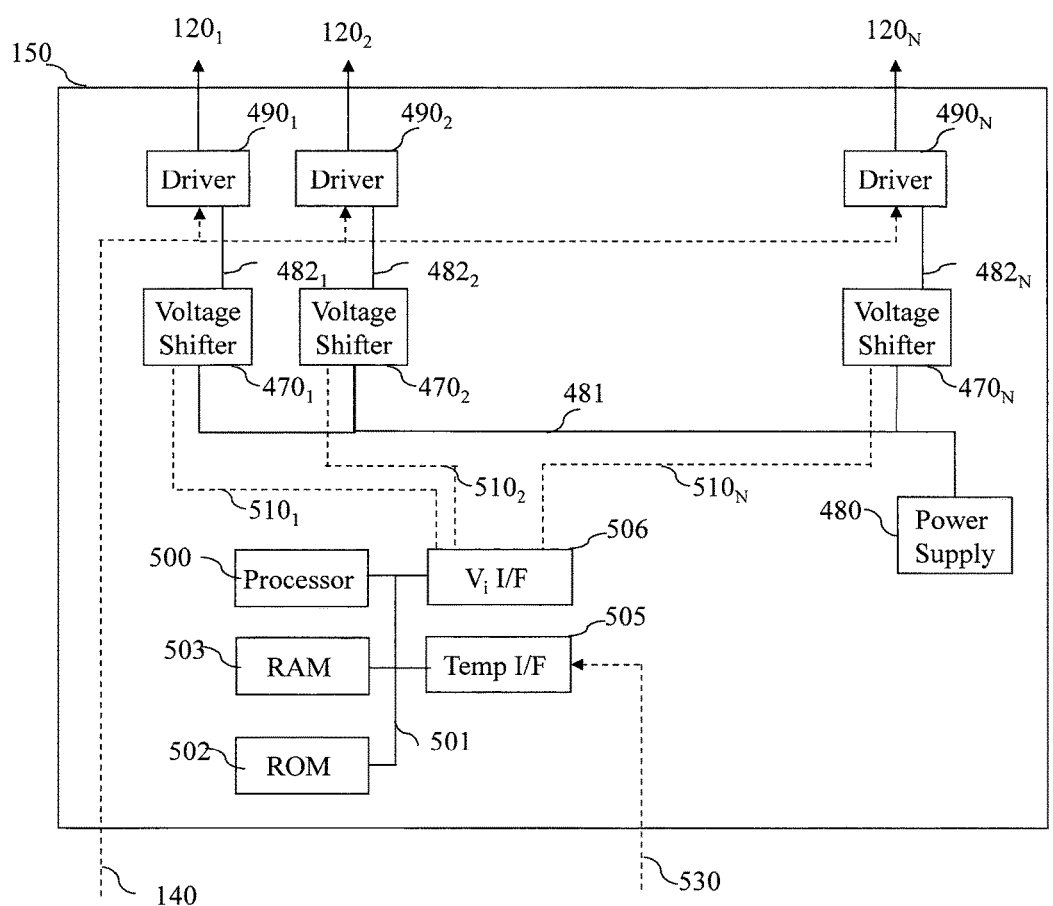

[Fig. 6]
(a)
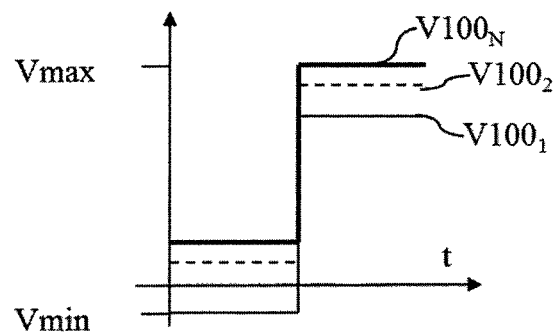
(b)
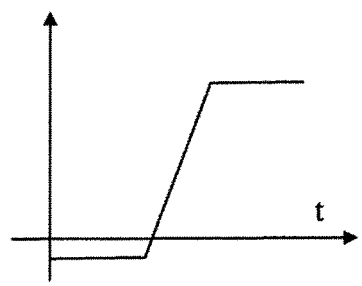
(c)
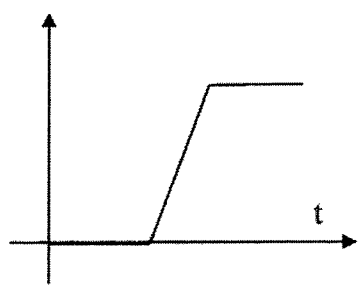

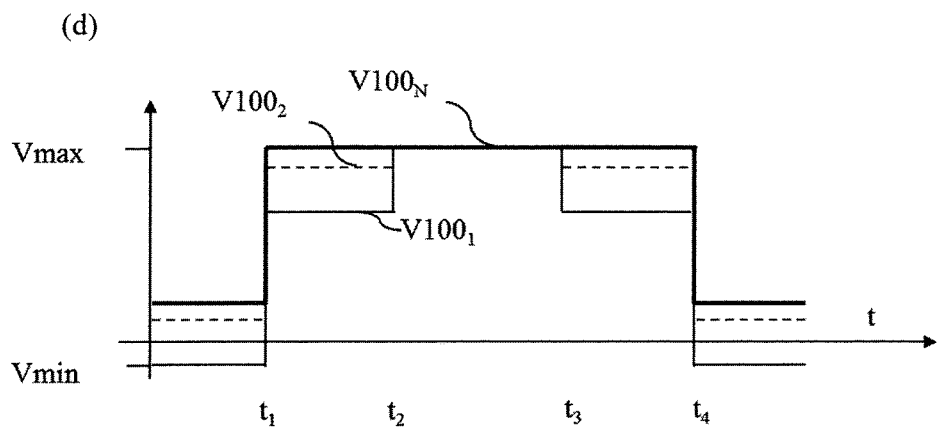
[Fig. 7]
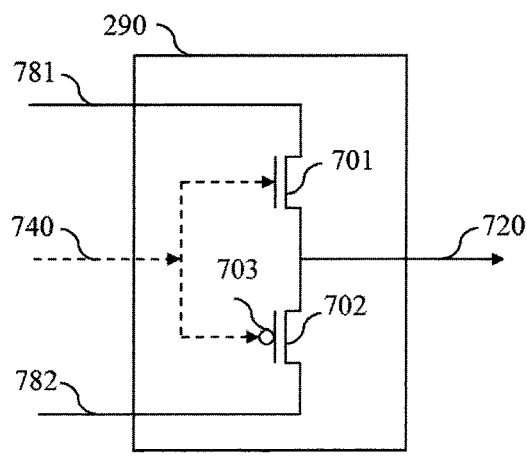

[Fig. 8]
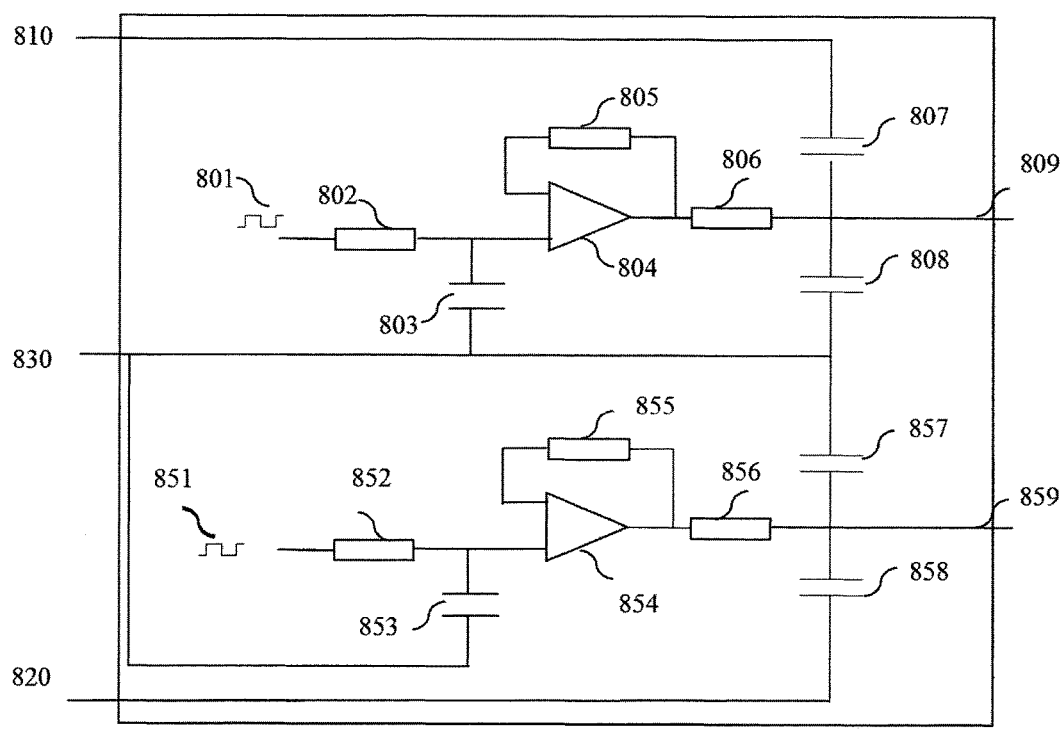

[Fig. 9]
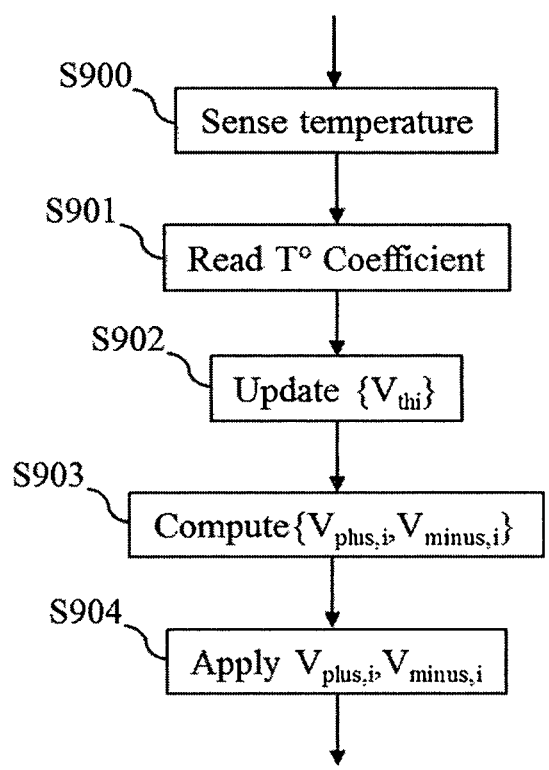

SYSTEM COMPRISING A MULTI-DIE POWER MODULE, AND METHOD FOR CONTROLLING THE SWITCHING OF A MULTI-DIE POWER MODULE

TECHNICAL FIELD

The present invention relates generally to a device for controlling the operation of a multi-die power module.

BACKGROUND ART

Multi-die power modules are classically composed of several parallel connected power dies and are used for increasing the current capability over that of a single power die.

For example, a three-phase converter is composed of four parallel power dies per switch, giving twenty four power dies in total.

Emerging devices technologies, such as SiC (Silicon Carbide) and GaN (Gallium Nitride) Transistors, are typically realized in high current density, small power dies due to limitations of yield and cost of wafer substrate.

In order to realize higher power SiC-based modules, a multitude of parallel connected SiC dies is necessary. Unlike parallel connected modules, parallel connected dies constitute a single switch that ideally commutates the same load current.

However, regardless of the type of die used, i.e. diodes or voltage-driven switch, e.g. MOSFETs (Metal Oxide Semiconductor Field Effect Transistor), characteristics exist within the dies that limit the balanced sharing of the load current both statically and dynamically. The incremental addition of each parallel die does not result in full utilization of the die, and thus, more dies are needed in parallel to achieve a given current rating, thereby increasing the overall costs and physical surface area of the power module.

Due to variation of electrical characteristics of power device at manufacture, the currents are not equally shared across dies, and especially during switching transitions.

One key electrical characteristic for the switching transient is the threshold voltage. For normally-on die, when the voltage across source and gate of a die is below the threshold voltage of the die, the die is in OFF state, i.e. not conducting. Above the threshold voltage, the die is in ON state, i.E. starts conducting current between the source and the drain of the die. When the threshold voltages are not perfectly aligned across parallel dies controlled with same gate to source voltage, currents are not equally shared across the dies during the transient. As a result, switching losses can significantly differ across parallel dies, leading to undesired temperature imbalance across dies, and eventually, early ageing of most stressed die.

SUMMARY OF INVENTION

The present invention aims at enhancing the switching speed of multi-die switches and to increase the maximum capability of a multi-die power module by balancing currents during switching transients for parallel-connected dies without need to implement highly dynamic control.

To that end, the present invention concerns a system comprising a multi-die power module composed of dies and a controller receiving input patterns for activating the dies of the multi-die power module, characterized in that the controller comprises means for generating from the input patterns gate to source signals to apply to the dies and for each die, the gate to source voltage is shifted according to a given voltage value.

The present invention concerns also a method for controlling the switching of a multi-die power module composed of dies, characterized in that the method comprises the steps, executed by a controller of:
   receiving input patterns for activating the dies of the multi-die power module,
   generating from the input patterns gate to source signals to apply to the dies and for each die, the gate to source voltage is shifted according to a given voltage value.

Thus, dies are controlled individually, even though they have different threshold voltage levels. Switching times of mismatched dies can be balanced, resulting in better current balancing across dies during the switching. As a result, switching losses are better spread across dies, spreading the aging stress across all dies and increasing the lifetime of the module.

According to a particular feature, the system further comprises temperature sensing means and the voltage shifts are dependent of the sensed temperature.

Thus, switching times across dies can be balanced when threshold voltage of dies evolves with temperature.

According to a particular feature, each given voltage value is determined from a threshold voltage obtained for each die.

Thus, the mismatch across threshold voltage can perfectly be compensated using proposed voltage shift, all dies switch at same time, perfect current sharing is obtained.

According to a particular feature, each given voltage value is equal to the threshold voltage obtained for each die plus a predetermined constant voltage which is identical for each die.

Thus, the given voltage value is easy to be determined. Mismatch across threshold voltage of dies can perfectly be compensated using proposed voltage shift, all dies switch at same time. All dies enter the "on" state at the same timing.

According to a particular feature, each voltage shift is obtained by providing a low level voltage and a high level voltage, each gate to source signal voltage equals the high level voltage when the input pattern indicates an activation of the dies of the power module and equals the low level voltage when the input pattern indicates a deactivation of the dies of the power module.

Thus, the voltage shift is easily realised, as low level and high level voltage sources are referenced to the same ground across dies.

According to a particular feature, the difference between low level voltage and high level voltage is identical for all dies.

Thus, during switching transient, the detailed evolution of internal gate to source junction voltage is the same across all dies. The time evolution of the drain-to-source current is the same across all dies. Perfect current sharing is realised during the switching transient. Switching losses are identical across dies.

According to a particular feature, the predetermined constant voltage is different for the low level and the high level voltages.

Thus, it is possible to control together the highest high voltage level across dies and the lowest low voltage level across dies. One can adapt the switching speeds independently for turn-on and turn-off.

According to a particular feature, the low level and a high level voltages are dependent of the maximum and the minimum gate-to-source voltage of dies.

Thus, the switching speed can be maximised both at turn-on and turn-off, while keeping a safe operation of all parallel dies.

According to a particular feature, each voltage shift is obtained by controlling at least one voltage source by a pulse width modulation.

Thus, the controller can easily adapt the individual voltage shift according to estimated threshold voltage by a simple decision of the duty cycle of the pulse width modulation. This adaptation can be made at manufacture, when threshold voltage have been measured individually per die, or on-line, when evolution of the threshold voltage is estimated from measured temperature.

According to a particular feature, each gate to source voltage of dies is set to the maximum gate to source voltage of dies after a predetermined time period following the reception of an input pattern for activating the dies of the power module.

Thus, conduction losses of all power dies are minimised during the conduction phase. As setting of each gate to source voltage of dies is set after the completion of switching to ON state, the minimisation of conduction losses is realised without affecting the identical switching losses obtained according to the invention.

The characteristics of the invention will emerge more clearly from a reading of the following description of example embodiments, the said description being produced with reference to the accompanying drawings, among which:

BRIEF DESCRIPTION OF DRAWINGS

FIG. 1 represents an example of a system for controlling the operation of a multi-die power module;

FIG. 2 represents the architecture of a multichip controller according to prior art;

FIG. 3 represents a first example of an architecture of a multichip controller according to the present invention;

FIG. 4 represents a second example of an architecture of a multichip controller according to the present invention;

FIG. 5 represents a third example of an architecture of a multichip controller according to the present invention;

FIGS. 6(a)-(d) represent voltage and currents through the multi-die power module according to the present invention;

FIG. 7 represents an example of an electric circuit of a gate driver;

FIG. 8 represents an example of a voltage shifter according to the present invention;

FIG. 9 represents an example of an algorithm for adjusting the gate to source voltages according to the temperature.

DESCRIPTION OF EMBODIMENTS

FIG. 1 represents an example of a system for controlling the operation of a multi-die power module.

The system for controlling the operation of a multi-die power module comprises a multi-die power module 10 and a multichip controller 150.

The multi-die power module 10 comprises N dies noted $100_1$ to $100_N$ that are connected in parallel to a source voltage 110 and a drain voltage 105.

The multichip controller 150 receives, from an external host controller, an input signal 140 for activating the multi-die power module 10. Using the signal for activating the multi-die power module 140, the multichip controller 150 provides, for each die $100_1$ to $100_N$, a gate-to source voltage $120_1$ to $120_N$. For that purpose, the multichip controller 150 is ground connected to the source voltage 110.

In a variant of invention, the multi-die power module 10 further comprises at least one means for sensing the temperature level of at least one die and temperature levels $130_1$ to $130_N$ of dies $100_1$ to $100_N$ are provided to the multichip controller 150. The multichip controller 150 may determine the gate-to source voltage $120_1$ to $120_N$ in order to balance temperature level $130_1$ to $130_N$ of dies $100_1$ to $100_N$.

The multichip controller 150 is disclosed in more details in reference to FIG. 2.

FIG. 2 represents the architecture of a multichip controller according to prior art.

The multichip controller 150 comprises a controller 260 that determines from the input signal 140 and from sensed temperature levels $130_1$ to $130_N$ individual activation patterns $241_1$ to $241_N$ for each die $100_1$ to $100_N$.

For each die, the individual activation pattern $241_1$ to $241_N$ is fed to a corresponding driver $290_1$ to $290_N$. All drivers 290 are supplied by a single power supply 280 through voltage bus 281, that provides a high voltage level $V_{plus}$ and a low voltage level $V_{minus}$. When the individual activation pattern 241 indicates to activate the die, the driver 290 outputs a gate to source voltage 120 which is equal to the high voltage level $V_{plus}$. Otherwise, the driver 290 outputs a gate to source voltage 120 which is equal to the high voltage level $V_{minus}$.

In prior art, all signals $120_1$ to $120_N$ share the same high and low voltage levels.

When the gate to Source voltage $120_i$, with i=1 to N, switches from a first value $\Delta V_{GSi}-V_{GSi}$ to a second value $V_{GSi}$, the transient equation of the current in the $i^{th}$ die during switching is given in the di/dt period by:

$$I_i(t) = g_{mi}\left(V_{GSi} - \Delta V_{GSi}e^{\frac{-t}{RiC_{GSi}}} - V_{thi}\right);$$

where t is the elapsed time since entering the linear region of the die, Ri is the gate resistance between driver 490; and the gate of the die $100_i$, $C_{GSi}$ is the Gate-Source internal capacitance of the die $100_i$, $V_{GSi}$ is the gate to source voltage $120_i$ applied to the die $100_i$, $V_{GSi}$ is the step, $I_i(t)$ is the current flowing through the $i^{th}$ die during the current switching transient, $g_{mi}$ is the transconductance of the $i^{th}$ die, $V_{thi}$ is the threshold voltage of the die $100_i$.

Each die having different characteristics, like for example, the transconductance $g_m$ and the threshold voltage $V_{th}$, the transient equation of the current flowing through each die of the multi-die power module may be different.

By adapting the activation pattern of each die according to the die temperature relative to the temperature of other dies, the multichip controller 150 keeps balancing of dies temperature across dies. As example dies with lowest temperature have same activation pattern as indicated by the input signal 140, while dies with highest temperature have smaller duration activation pattern than indicated by the input signal 140.

In presence of dies with mismatched threshold voltage $V_{thi}$ and due to the intrinsic on/off behaviour of gate-to source voltage $120_1$ to $120_N$, the currents $I_i(t)$ can not be balanced across dies during the switching transients. Despite the good average temperature balancing ability, this may cause severe overcurrent on at least one die and may result in early damaging of said at least one die.

FIG. 3 represents a first example of an architecture of a multichip controller according to the present invention.

The multichip controller 150 comprises a single driver 390, which operates similarly to drivers $290_1$ to $290_N$ as described in FIG. 2, a power supply 380, which operates similarly to power supply 280 as described in FIG. 2, and stabilised voltage sources $310_1$ to $310_N$ connected in series between the output of driver 390 and the gates of dies $100_1$ to $100_N$.

Each stabilised voltage source $310_1$ to $310_N$ provides, according to the present invention, a voltage $V_1$ to $V_N$. Each voltage $V_1$ to $V_N$ is adjusted in order to take into account the different threshold voltages $V_{th1}$ to $V_{thN}$.

As a result, the gate to source voltages $120_1$ to $120_N$ have the same activation patterns as the input signal 140, but the high and low levels of the gate to source voltages $120_1$ to $120_N$ are different.

$$V_{high,i} = V_{plus} + V_i$$

$$V_{low,i} = V_{minus} + V_i$$

The output voltage levels $V_1$ to $V_N$ of the stabilised voltage sources $310_1$ to $310_N$ are as example determined at manufacture after sensing the individual threshold voltages $V_{th1}$ to $V_{thN}$ of the dies $100_1$ to $100_N$. For each die $100_i$, the output voltage $V_i$ equals the sensed threshold voltage $V_{thi}$ plus a predetermined constant voltage level $V_c$, which is the same for all the dies. As example, the predetermined constant voltage level $V_c$ is determined to limit the gate to source voltages $120_1$ to $120_N$ below the maximum gate to source voltage given by the datasheet of the dies.

As example, the stabilised voltage sources $310_1$ to $310_N$ are implemented as charge pump converters, supplied by the power supply 380.

As a result, during the di/dt period of the switching transition, the current through dies $100_1$ to $100_N$ are matched according to $$I_i(t) = g_{mi} V_{Drive}(t)$$

where t is the elapsed time since entering the linear region of the dies, $$V_{Drive} \text{ equals } V_{minus} + V_C - (V_{minus} - V_{plus})e^{\frac{-t}{RC_{GS}}}$$

when the signal 140 indicates an activation and, $$V_{Drive} \text{ equals } V_{minus} + V_C - (V_{minus} - V_{plus})e^{\frac{-t}{RC_{GS}}}$$

when the signal indicates a deactivation, where R is the gate resistance between driver $490_1$ to $490_N$ and the gates of the dies $100_1$ to $100_N$, $C_{GS}$ is the Gate-Source internal capacitance of the die.

According to the invention, $V_{Drive}$ is identical across all dies, as proven in the following development: when the signal 140 indicates an activation, $V_{GSi} = V_{high,i}$ and $\Delta V_{GSi} = V_{high,i} - V_{low,i}$, thus $$V_{Drive}(t) = V_{GSi} - \Delta V_{GSi} e^{\frac{-t}{RC_{GS}}} - V_{thi}$$

$$= V_{high,i} - (V_{high,i} - V_{low,i}) e^{\frac{-t}{RC_{GS}}} - V_{thi}$$

$$= V_{plus} + V_C - (V_{plus} - V_{minus}) e^{\frac{-t}{RC_{GS}}}$$

When the signal 140 indicates an deactivation, $V_{GSi} = V_{low,i}$ and $\Delta V_{GSi} = V_{low,i} - V_{high,i}$, thus $$V_{Drive}(t) = V_{GSi} - \Delta V_{GSi} e^{\frac{-t}{RC_{GS}}} - V_{thi}$$

$$= V_{low,i} - (V_{low,i} - V_{high,i}) e^{\frac{-t}{RC_{GS}}} - V_{thi}$$

$$= V_{minus} + V_C - (V_{minus} - V_{plus}) e^{\frac{-t}{RC_{GS}}}$$

As a result, the dies switch at the same timing and share the same switching losses during the transient period of the current in each die. The stress is then properly distributed across dies, and temperature levels get balanced.

FIG. 4 represents a second example of an architecture of a multichip controller according to the present invention.

The multichip controller 150 comprises a power supply 480, operating similarly to the power supply 280 as described in FIG. 2, that feeds low and high voltage levels to voltage shifters $470_1$ to $470_N$ through a voltage bus 481.

For each die 100; with i=1 to N, a corresponding voltage shifter $470_i$ feeds individual low and high voltage levels to a Driver $490_i$ through an individual voltage bus $482_i$. The drivers $490_1$ to $490_N$ operate similarly to the drivers $290_1$ to $290_N$ as described in FIG. 2, and are controlled by the same input signal 140.

For each die $100_i$, the low voltage level $V_{low,i}$ and the high voltage levels $V_{high,i}$ fed to the driver $490_i$ by the voltage shifter $470_i$ are determined as $$V_{high,i} = V_{plus} + V_i$$

$$V_{low,i} = V_{minus} + V_i$$

As example, each voltage shifter $470_i$ is composed of two stabilised voltage sources, operating similarly to the stabilised voltage sources $310_1$ to $310_N$ as described in FIG. 3.

The first stabilised voltage source generates the output low voltage signal $V_{low,i}$ from the input low voltage $V_{minus}$ and a predetermined compensation voltage $V_i$ determined similarly to the output voltage $V_i$ of the stabilised voltage sources $310_1$ to $310_N$ as described in FIG. 3.

The second stabilised voltage source generates the output high voltage signal $V_{high,i}$ from the input high voltage $V_{plus}$ and a predetermined compensation voltage $V_i$ determined similarly to the output voltage $V_i$ of the stabilised voltage sources $310_1$ to $310_N$ as described in FIG. 3.

It is to be noted that same compensation voltage $V_i$ is used for both high and low voltage levels for a given die.

As a result, the current through dies $100_1$ to $100_N$ are matched according to $$I_i(t) = g_{mi} V_{Drive}(t)$$

as described in FIG. 3.

In a variant, for each die $100_i$, the individual low voltage level $V_{low,i}$ and high voltage levels $V_{high,i}$ fed to the driver $490_i$ by the voltage shifter $470_i$ are determined as $$V_{high,i} = V_{max} - \max(\{V_{thj}\}) + V_{thi}$$

$$V_{low,i} = V_{min} - \min(\{V_{thj}\}) + V_{thi}$$

where $V_{max}$ and $V_{min}$ are respectively the maximum and the minimum gate-to-source voltage of dies determined according to the maximum and the minimum values given by the datasheet of the dies 100. As a result, the threshold voltage mismatches are compensated, the range of the gate-to-source-voltage is respected for all the dies 100, while maximising the switching speed of all dies 100.

According to the variant, $V_c$ is different for the high and low voltage levels. Yet, for a given transition to On or Off state, $V_{Drive}$ (t) levels are still identical across dies. As a result, the switching of the dies 100 triggers at same timing, and the dies 100 share the same switching losses. The stress is then properly distributed across the dies 100 and the temperature levels get balanced.

FIG. 5 represents a third example of an architecture of a multichip controller according to the present invention.

The multichip controller 150 has, for example, an architecture based on components connected together by a bus 501 and a processor 500 controlled by a program in order to adjust the voltages $V_i$ according to the sensed temperature.

The bus 501 links the processor 500 to a read only memory ROM 502, a random access memory RAM 503, a temperature interface 505 and a voltages control interface 506.

The memory 503 contains registers intended to receive variables and the instructions of the program related to the program disclosed in FIG. 9 which adjusts the voltages $V_{high,i}$ and $V_{low,i}$ according to the sensed temperature.

The processor 500 receives sensed temperature level of at least one die 100₁ to 100_N from temperature interface 505 and transfers voltages to apply to the voltages control interface 506.

The read only memory 502 contains instructions and parameters of the program which adjusts the voltage $V_{high,i}$ and $V_{low,i}$ as disclosed in FIG. 9 according to the sensed temperature, and which is transferred to the random access memory 503 when the multichip controller 150 is powered on.

In a first variant, the read only memory further contains the threshold voltage of each die measured under a reference temperature, and a temperature coefficient.

In a second variant, the read only memory further contains a lookup table, which associates to sensed temperature the high and low voltage levels $V_{high,i}$ and $V_{low,i}$ to be generated by voltage shifters 470 described in FIG. 4.

In a third variant, the read only memory further contains a lookup table, which associates to sensed temperature the duty cycles of PWM generators disclosed in FIG. 8.

The multichip controller 150 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the multichip controller 150 includes circuitry, or a device including circuitry, causing the controller 104 to perform the program which adjusts the voltages $V_i$ according to the sensed temperature.

The processor 500 determines voltages $V_{high,i}$ and $V_{low,i}$ according to formulas as disclosed in reference to FIG. 4. The multichip controller 150 may be realized, for example, by a pre-programmed CPLD (Complex Programmable Logic Device).

FIG. 6 represents voltage and currents through the multi-die power module according to the present invention.

The FIG. 6a represents the shifted gate-to source voltage 120₁ to 120_N provided to the dies 100₁ to 100_N. The high and low levels are set individually per die. The difference between high and low levels is same for all dies. The triggering time is the same for all dies. The difference between high levels across dies equals the difference between threshold voltage across dies.

The FIG. 6b represents the variation during transient of $V_{Drive}$(t) according to the present invention. As $V_{Drive}$ (t) are identical across dies, the current flowing through the dies 100 is identical.

The FIG. 6c represents the drain to source currents Ii(t) flowing through the dies 100 during the switching. Because mismatch between threshold voltage is compensated according to the present invention by shifting the gate-to-source voltages, all the dies switch together at the same time and share the same current waveform during the switching transient.

The FIG. 6d represents the shifted gate to source voltage 120₁ to 120_N provided to the dies 100₁ to 100_N according to a variant of the invention.

Prior to time t1, the input signal 140 does not indicate to activate the dies of the power module, and each gate to source voltage is set to individual voltage $V_{low,i}$.

At time $t_1$, the input signal 140 indicates to activate the dies of the power module, and gate driver 490i switches its output to the voltage $V_{high,i}$.

At time $t_2$, following the input signal at time $t_1$, the processor 500 indicates each voltage shifter 490_i to switch to its high voltage level $V_{high,i}$, to the maximum gate-to-source voltage level $V_{max}$. The effect of maximising the Gate to source voltage levels after the switching is a reduction of conduction losses in the power dies 100₁ to 100_N. As the maximisation of high level gate-to-source voltage is realised after the switching, switching transients are not affected and switching losses are unmodified.

At time $t_3$, the input signal 140 indicates to de activate the dies of the power module, and the processor 500 indicates each voltage shifter 490_i to switch to its high voltage level $V_{high,i}$.

After some predetermined delay, at time $t_4$, gate driver 490i switches its output to the low voltage level $V_{low,i}$. The predetermined delay is set to have effective setting of high level gate-to-source voltage individually per die according to algorithm disclosed in FIG. 9. As a result, the power dies are ready to switch simultaneously after time $t_4$, according to the invention.

During the conduction phase of the power module, between times $t_2$ and $t_3$, the gate-to-source voltage is maximised for all power dies. This reduces the equivalent series resistance of all MOSFET dies and the Collector-Emitter voltage of IGBT dies. As a result, the conduction losses are minimised.

At time $t_3$, following the time $t_2$, the processor 500 adjusts individual voltages $V_{high,i}$ to the maximum Gate to source voltage level. Difference between times $t_3$ and $t_2$ is predetermined to be higher than the switching time of the power module.

The high and low levels are set individually per die. The difference between high and low levels is same for all the dies. The triggering time is same for all dies. The difference between high levels across the dies equals the difference between threshold voltage across the dies.

FIG. 7 represents an example of an electric circuit of a gate driver.

The gate driver comprises two fast low power switches 701 and 702. The switch 701 is controlled by input signal 740, and the switch 702 is controlled by the complement of the signal 740. The complement of the signal 740 is obtained by means 703. When the input signal 740 has a high value, the switch 701 is conducting while the switch 702 is blocked, thus the output 720 delivers the high voltage delivered by the signal 781. When the input signal 740 has a low value, the switch 702 is conducting while the switch 701 is blocked, the output signal 720 is the low voltage delivered by the signal 782.

FIG. 8 represents an implementation of voltage level shifter according to the invention.

The voltage shifter comprises two PWM generators 801 and 802, resistances 802, 805, 806, 852, 855, 856, capacitors 803, 807, 808, 853, 857, 858, operational amplifiers 804 and 854.

The input connector 810 delivers a high voltage source, the input connector 820 delivers a low voltage source, the input connector 830 delivers a reference voltage source.

The output connector 809 delivers a stabilised high voltage source, which voltage equals the voltage of capacitor 808 and which current flows from the input 810 through the capacitor 807. The voltage of the capacitor 808 is controlled by an amplifier circuit composed of the operational amplifier 804 and the resistances 805 and 806. The amplifier circuit amplifies the voltage of the capacitor 803 with fixed ratio determined by the resistances 805 and 806.

The operational amplifier 804 is power supplied by the inputs 810 and 830. The voltage of the capacitor 803 is stabilised by the filtering of the PWM signal delivered by the PWM signal 801 through a filter circuit composed of the resistance 802 and the capacitor 803.

According to invention, the duty cycle of PWM signal 801 is set to a predetermined value in order to control the output voltage 809 to a predetermined value $V_{high,i}$.

The output signal 859 delivers a stabilised high voltage source, which voltage equals the voltage of the capacitor 858 and which current flows from the input 820 through the capacitor 857.

The voltage of the capacitor 858 is controlled by the amplifier circuit composed of the operational amplifier 854 and the resistances 855 and 856.

The amplifier circuit amplifies the voltage of the capacitor 853 with a fixed ratio determined by the resistances 855 and 856. The operational amplifier 854 is power supplied by the signals 810 and 830. The voltage of the capacitor 853 is stabilised by the filtering of the PWM signal 851 through a filter circuit composed of the resistance 852 and the capacitor 853.

According to invention, the duty cycle of the PWM signal 851 is set to a predetermined value in order to control the output voltage 859 to a predetermined value $V_{low,i}$.

FIG. 9 represents an example of an algorithm for adjusting the gate to source voltages according to the temperature.

More precisely, the present algorithm is executed by the processor 500 of the gate to source voltage shifting module 150.

At step S900, the processor receives sensed temperature level of at least one die $100_1$ to $100_N$ from temperature interface 505.

At next step S901, the processor 500 reads the temperature coefficient and the threshold voltage of dies measured at a reference temperature.

At next step S902, the processor 500 determines the threshold voltage of dies at sensed temperature level. For each die, the determined threshold voltage equals the threshold voltage of dies measured at a reference temperature, plus the temperature coefficient times the difference between the sensed temperature and the reference temperature.

At next step S903, the processor 500 determines for each die the low and high voltage levels $V_{low,i}$ and $V_{high,i}$ of the corresponding voltage shifters using equations disclosed in FIG. 4.

At next step S904, the processor 500 applies the determined low and high voltage levels of the corresponding voltage shifters. As example, processor 500 computes duty cycles of PWM generators 801 and 802 described in FIG. 8, which corresponds to the determined low and high voltage levels $V_{low,i}$ and $V_{high,i}$, and commands the PWM generators 801 and 802 to operate the computed duty cycles through the voltages control interface 506.

The invention claimed is:

1. System comprising a multi-die power module composed of dies and a controller receiving input patterns for activating the dies of the multi-die power module, characterized in that the controller comprises means for generating from the input patterns gate to source signals to apply to the dies and for each die, the gate to source voltage is shifted in voltage by a given voltage value,
wherein each given voltage value is equal to the threshold voltage obtained for each die plus a predetermined constant voltage which is identical for each die.

2. System according to claim 1, characterized in that the system further comprises temperature sensing means and the voltage shifts are dependent of the sensed temperature.

3. System according to claim 1, characterized in that each given voltage value is determined from a threshold voltage obtained for each die.

4. System according to claim 1, characterized in that each voltage shift is obtained by providing a low level voltage and a high level voltage, each gate to source signal voltage equals the high level voltage when the input pattern indicates an activation of the dies of the power module and equals the low level voltage when the input pattern indicates a deactivation of the dies of the power modules.

5. System according to claim 4, characterized in that the difference between low level voltage and high level voltage is identical for all dies.

6. System according to claim 4, characterized in that the predetermined constant voltage is different for the low level and the high level voltages.

7. System according to claim 4, characterized in that the low level and a high level voltages are dependent of the maximum and the minimum gate to source voltage of dies.

8. System according to claim 1, characterized in that each voltage shift is obtained by controlling at least one voltage source by a pulse width modulation.

9. System according to claim 1, characterized in that each gate to source voltage of dies is set to a maximum gate-to-source voltage of dies after a predetermined time period following the reception of an input pattern for activating the dies of the power module.

10. Method for controlling the switching of a multi-die power module composed of dies, characterized in that the method comprises the steps, executed by a controller of:
receiving input patterns for activating the dies of the multi-die power module,
generating from the input patterns gate to source signals to apply to the dies and for each die, the gate to source voltage is shifted in voltage by a given voltage value,
wherein each given voltage value is equal to the threshold voltage obtained for each die plus a predetermined constant voltage which is identical for each die.

* * * * *